US 6,747,891 B2

(12) United States Patent
Hoffmann et al.

(10) Patent No.: US 6,747,891 B2
(45) Date of Patent: Jun. 8, 2004

(54) CIRCUIT FOR NON-DESTRUCTIVE, SELF-NORMALIZING READING-OUT OF MRAM MEMORY CELLS

(75) Inventors: Kurt Hoffmann, Taufkirchen (DE); Oskar Kowarik, Neubiberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/447,358

(22) Filed: May 29, 2003

(65) Prior Publication Data

US 2004/0017712 A1 Jan. 29, 2004

Related U.S. Application Data

(63) Continuation of application No. PCT/DE01/04312, filed on Nov. 16, 2001.

(30) Foreign Application Priority Data

Nov. 29, 2000 (DE) .......................... 100 59 182

(51) Int. Cl.$^7$ ................................ G11C 7/02
(52) U.S. Cl. ...................... 365/158; 365/207
(58) Field of Search ........................ 365/158, 173, 365/189.07, 207

(56) References Cited

U.S. PATENT DOCUMENTS 6,055,178 A   4/2000 Naji ..................... 365/158
6,388,917 B2   5/2002 Hoffmann et al. ......... 365/158
6,625,076 B2 * 9/2003 Weber et al. ............ 365/207
6,674,679 B1 * 1/2004 Perner et al. ........... 365/209

FOREIGN PATENT DOCUMENTS

DE    100 36 140 C1   12/2001

OTHER PUBLICATIONS

R.C. Sousa et al.: "Vertical integration of a spin dependent tunnel junction with an amorphous Si diode", *Applied Physics Letters*, vol 74, No. 25, Jun. 21, 1999, pp. 3893–3895.

Roy Scheuerlein et al.: "A 10ns Read and Write Non–Volatile Memory Array Using a Magnetic Tunnel Junction and FET Switch in each Cell", *2000 IEEE International Solid–State Circuits Conference*, pp. 128–129.

* cited by examiner

*Primary Examiner*—Tan T. Nguyen
(74) *Attorney, Agent, or Firm*—Laurence A. Greenberg; Werner H. Stemer; Ralph E. Locher (57) ABSTRACT

A circuit is provided for the non-destructive, self-normalizing reading-out of MRAM memory cells. Accordingly, read currents of a memory cell are normalized by currents that are maintained at a voltage at which the size of these currents is independent of the cell content. The circuit has a simple construction and without great expenditure, permits the normalization of a read signal.

11 Claims, 5 Drawing Sheets

CIRCUIT FOR NON-DESTRUCTIVE, SELF-NORMALIZING READING-OUT OF MRAM MEMORY CELLS

CROSS-REFERENCE TO RELATED APPLICATION

This application is a continuation of copending International Application No. PCT/DE01/04312, filed Nov. 16, 2001, which designated the United States and was not published in English.

BACKGROUND OF THE INVENTION

Field of the Invention

The invention relates to a circuit for non-destructive, self-normalizing reading-out of MRAM memory cells (MRAM=magnetoresistive RAM). A normal resistance value $R_{norm}$ of a memory cell is determined at a voltage at which the resistance value of the memory cell is independent of its cell content, and the actual resistance value R(0) or R(1) of the memory cell is determined at a voltage at which the resistance value of the memory cell depends on its cell content. The actual resistance value is then normalized by the normal resistance value by the equation:

$R_{norm}(0)=R(0)/R_{norm}$ and, respectively, $R_{norm}(1)=R(1)/R_{norm}$.

$R_{norm}(0)$ and $R_{norm}(1)$ are then compared with a reference value, and in which, finally, the memory cell content is detected as a 0 or 1 on the basis of the comparison result.

Figure 5:
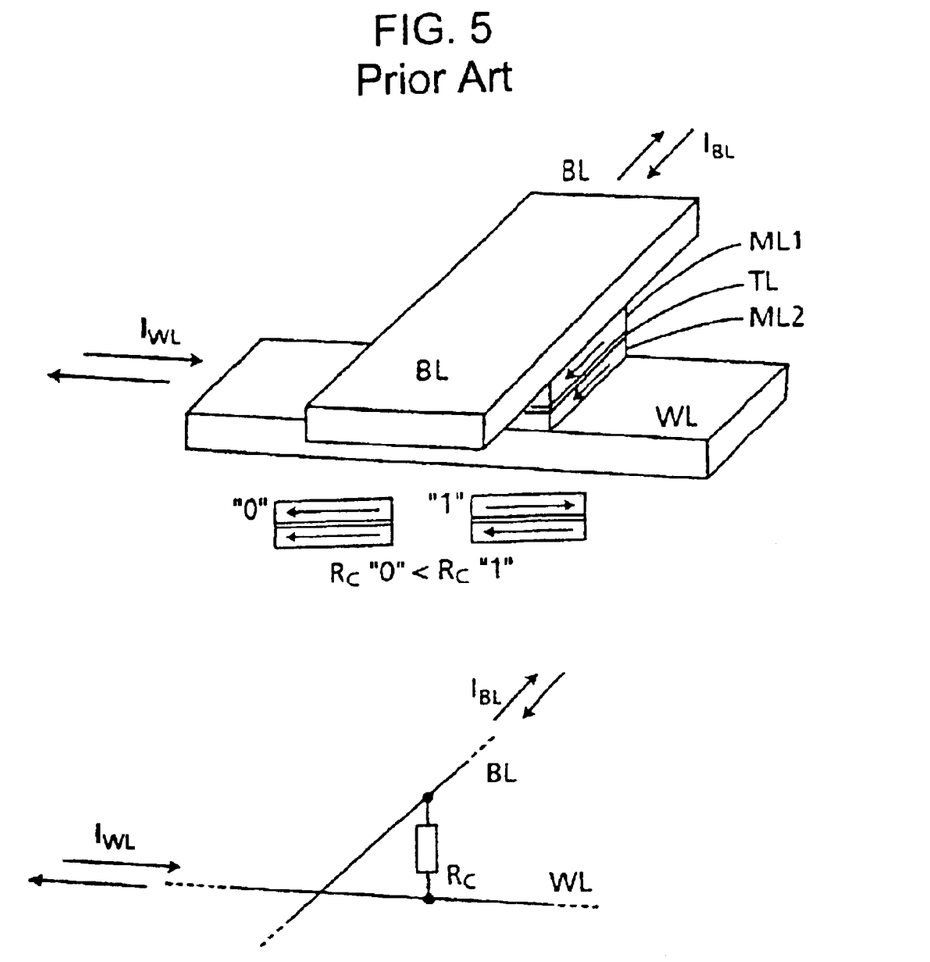
FIG. 5 is a diagrammatic, perspective view of a representation of an MTJ memory cell, with an equivalent circuit diagram according to the prior art.

A memory cell of an MRAM is shown schematically in FIG. 5. In such a memory cell, information to be stored is stored by the type of alignment of magnetic moments in adjacent magnetized layers ML1 and ML2, which are separated from each other by a very thin, nonmagnetic and nonconductive intermediate layer TL. This is because the magnitude of the electrical resistance across the memory cell depends on the parallel or anti-parallel alignment of the magnetic moments in the magnetized layers ML1 and ML2, that is to say their polarization. In the case of parallel alignment of the magnetic moments in the two layers ML1 and ML2, the resistance value of the memory cell is generally lower than in the case of their anti-parallel alignment. This effect is also termed the tunneling magnetoresistive (TMR) effect or the magnetic tunnel junction (MTJ) effect. A memory cell containing the layers ML1, TL and ML2 is therefore also known by the name MTJ cell.

It is therefore possible for the stored content of the memory cell to be read out by detecting the resistance value of the memory cell, which is different for a "1" and "0", respectively. Parallel magnetization of the two layers ML1 and ML2 can, for example, be assigned to a digital zero, the anti-parallel magnetization of these layers then corresponding to a digital one.

The resistance change between a parallel and anti-parallel alignment of the magnetic moments in the magnetized layers ML1 and ML2 is based physically on the interaction of the electron pins of the conduction electrons in the thin non-magnetic intermediate layer TL with the magnetic moments in the magnetized layers ML1 and ML2 of the memory cell. Here, "thin" is intended to express the fact that the conduction electrons are able to cross the intermediate layer TL without spin/scattering processes.

One of the two magnetized layers ML1 and ML2 is preferably coupled with its magnetization to an antiferromagnetic under layer or covering layer, as a result of which the magnetization in this magnetized layer remains substantially fixed, while the magnetic moment of the other magnetized layer can be aligned freely even under small magnetic fields, such as are produced, for example, by a current in a word line WL and a bit line BL over and under the magnetized layer.

In a memory cell array, programming currents $I_{WL}$ and $I_{BL}$ through the word line WL and through the bit line BL are selected in such a way that a magnetic field which is sufficiently strong for programming, as a result of the sum of the two currents $I_{WL}$ and $I_{BL}$, prevails only in the cell in which the word line WL crosses the bit line BL, while all the other memory cells located on the word line WL and the bit line BL cannot be reprogrammed by the current flowing only through one of these two lines.

In the lower half of FIG. 5, a resistance $R_C$ of the memory cell between the bit line BL and the word line WL is once more illustrated schematically, the resistance $R_C$ being greater for an anti-parallel alignment of the magnetic moments in the layers ML1 and ML2 than for a parallel alignment of the magnetic moments, that is to say $R_C$ ("0")<$R_c$ ("1"), if the above assumption for the assignment of "1" and "0" is used as a basis.

In their simplest embodiment, MRAMs have conductor tracks that cross in the form of a matrix for the word lines WL and the bit lines BL, via which the memory cells are activated. An upper conductor track, for example the bit line BL (see FIG. 5) is in this case connected to the upper magnetized layer ML1, for example a ferromagnetic layer, while the lower conductor track, which forms the word line WL, is connected to the lower magnetized layer ML2, which may likewise be a ferromagnetic layer. If a voltage is applied to the memory cell via the two conductor tracks for the word line WL and the bit line BL, then a tunnel current flows through the thin nonmagnetized intermediate layer TL. The thin nonmagnetic intermediate layer then forms the resistance $R_C$ which, depending on the parallel or anti-parallel alignment of the magnetic moments, that is to say the parallel or anti-parallel polarization of the upper and lower ferromagnetic layer ML1 and ML2, assumes the magnitude $R_C$ ("0")<$R_C$ ("1") or $R_C$ ("1")=$R_C$ ("0")+$\Delta R_C$ given a suitable voltage across the memory cell.

Figure 6:
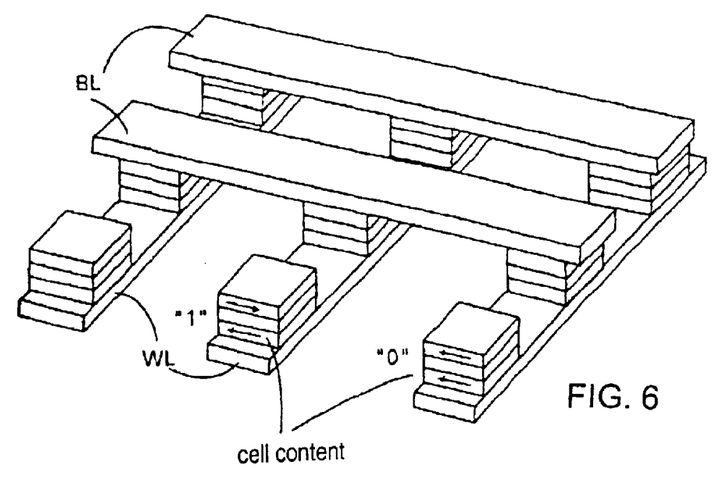
FIG. 6 is a perspective view of the cell architecture for an MTJ memory cell array.

FIG. 6 shows a memory cell array, in which memory cells are disposed in the form of a matrix at crossing points between the word lines WL and the bit lines BL.

The cell contents are indicated schematically here for two memory cells as "1" and "0", depending on the anti-parallel or parallel polarization.

In a memory cell array, such as is shown in FIG. 6, not only does a current then flow via the memory cell at the crossing point between a selected word line WL and a selected bit line BL, but undesired secondary currents also occur on further memory cells, which are in each case connected to the selected word line WL and the selected bit line BL. These undesired secondary currents interfere to a considerable extent with the read current that flows through the selected memory cell.

Attempts have therefore already been made to separate undesired secondary currents from the read current to a great extent, by suitable wiring of the memory cell array, so that only the read current through the selected memory cell or the read voltage across the memory cell is available for detection. In this case, however, the resistance value of the memory cells must be selected to be high and, in particular, in the MOhm range, because of the parasitic currents through the other memory cells, in order to be able to construct sufficiently large memory cell arrays.

Another way of avoiding the undesired secondary currents is to supplement an MTJ memory cell of intrinsically simple construction (see FIG. 7A), by a diode D (see FIG. 7B), or by a switching transistor T (see FIG. 7C) (see the references by R. Scheuerlein e.a., titled "A 10 ns Read and Write Time Non-Volatile Memory Array Using a Magnetic Tunnel Junction and FET-Switch in each Cell", ISSCC February 2000 p. 128/and R. C. Sousa e.a., titled "Vertical Integration Of A Spin Dependent Tunnel Junction With An Amorphous Si Diode", appl. Phys. Letter Vol. 74, No. 25, pp. 3893 to 3895).

The advantage of such supplementation by the diode D or the switching transistor T resides in the fact that, with such circuitry, in a memory cell array only a read current flows through the selected memory cell, since all the other memory cells are turned off. As a result, the resistance value of the memory cell can be selected to be lower, as opposed to a pure MTJ cell corresponding to FIG. 7A, as a result of which the read current becomes relatively high and reading can be carried out quickly in the ns range. However, the disadvantage of such additional circuitry with a diode or a transistor is the considerable additional expenditure on technology and area necessitated thereby.

In the case of the current prior art, the common factor in all memory cell types is that the detection or evaluation of a read signal as a "0" or "1" is very difficult, since the tunnel resistance formed by the sequence of the layers ML1, TL and ML2 generally fluctuates to a much greater extent, that is to say up to 40%, not only over one wafer but even, in many cases, between adjacent memory cells, than the difference in the resistance $\Delta R_C$ between a "1" state and a "0" state, which is, for example, only 15%. In other words, these conditions make reliable detection of the contents of a memory cell considerably more difficult or even impossible.

In the case of other memory types differing from MRAMs, the detection of a "1" or a "0" from a current or voltage read signal is carried out by the read signal either being compared with a reference current or a reference voltage, which is intended to lie in the center between the read current or a read voltage for a "1" and the read current or the read voltage for a "0", in order in this way to achieve the best signal-to-noise ratio in each case for both digital values. The reference current or the reference voltage can be generated via reference sources or else via reference cells, into which a "1" and a "0" have been written permanently.

Nevertheless, such a procedure can be employed only in a restricted manner, if at all, for the detection of the read signal in an MTJ cell, which can be attributed to the severe fluctuation in the tunnel resistance, outlined at the beginning, from memory cell to memory cell and over the entire wafer.

In order to solve the problems indicated above, there have hitherto been only two approaches. A first approach (in this regard, see the reference by R. Scheuerlein e.a., titled "A 10 ns Read and Write Time Non-volatile Memory Array Using a Magnetic Tunnel Junction and FET-Switch in each Cell", ISSCC February 2000, p. 128) is suitable for MTJ cells having a switching transistor (see FIG. 7C) and consists in using two adjacent complementary memory cells to store only one cell content, the stored content always being written into the first memory cell and the complement of the stored content, that is to say the negated stored content, always being written into the second memory cell. During the reading operation, both memory cells are read and the contents detected. The read signal and the signal-to-noise ratio are twice as high here as in the conventional reference method explained above. However, the required space and the expenditure on technology for two memory cells and two switching transistors are also very high, and it is necessary to ensure that the resistance fluctuations between the two adjacent complementary cells are so small that reliable detection can be carried out.

Figure 7A:
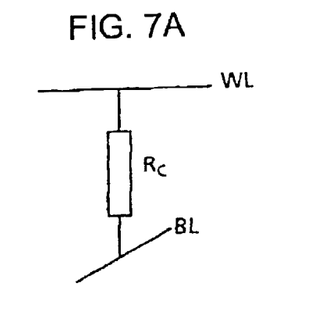
FIGS. 7A to 7C are equivalent circuit diagrams for an MTJ memory cell, an MTJ memory cell with a diode and an MTJ memory cell with a transistor.
Figure 7B:
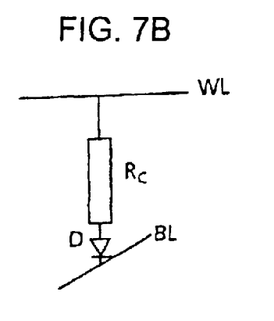
Figure 7C:
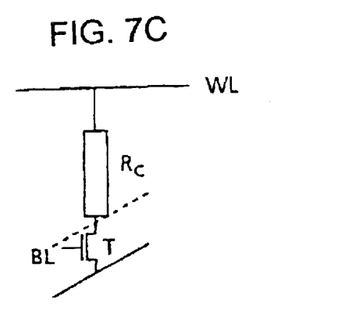

This precondition is not necessary in the case of the second approach, which is based on self-referencing of a read pure MTJ memory cell (see FIG. 7A). In this case, first, the cell content of a selected memory cell is read and stored. Then, for example, a "0" is programmed into the memory cell. The content of the "0" programmed into the memory cell is subsequently read and stored. The cell content stored first is compared with the stored known "0" and detected, and the cell content detected in this way is written back into the memory cell again.

Now, the disadvantage with such a procedure is that during the detection of the read signal, a predefined half read signal must be added to the "0" programmed in as reference and read out again, as a result of which resistance fluctuations again enter into the detection of the memory cell.

Figure 8A:
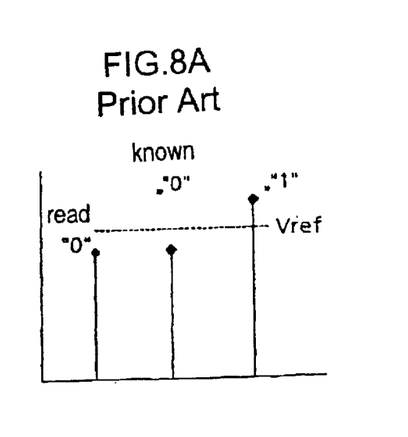
FIGS. 8A and 8B are graphs for explaining the detection of a "0" and a "1" in a conventional method according to the prior art.
Figure 8B:
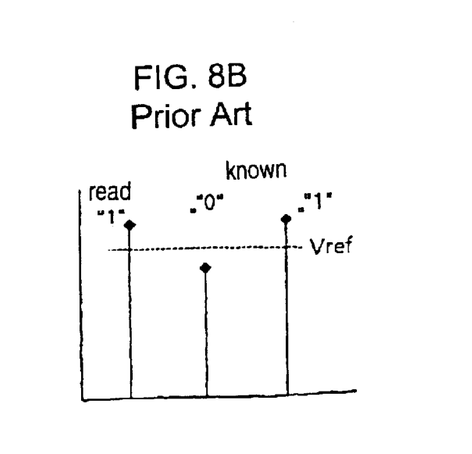

In order then to be completely independent of resistance fluctuations in the memory cells, in the second approach, the method just explained has to be completed by writing a "1". There is then the following method sequence:

(a) the cell content of a selected memory cell is read and stored;

(b) a "0", for example, is programmed into the memory cell;

(c) the content of the "0" programmed into the memory cell is read and stored;

(d) a "1" is programmed into the memory cell;

(e) the content of the "1" programmed into the memory cell is read and stored;

(f) the stored cell content from (a) is compared with the stored magnitude "1" and "0" from (c) and (e) and detected, which is carried out by forming a reference voltage $V_{ref}$ from the known "0" and "1", in each case only half the read signal difference being available for the detection of the "1" or "0" read as indicated for a read "0" in FIG. 8A and for a read "1" in FIG. 8B; and (g) the detected cell content is finally written back into the memory cell again.

As a result of the "1" and "0" written and read, the method according to the second approach generates the reference voltage in the selected memory cell itself, so that resistance fluctuations from memory cell to memory cell have no influence on the detection. The signal-to-noise ratio of a "1" or a "0" is, however, only half as great as in the method described first using complementary cells in accordance with the first approach. The considerable disadvantage of the method according to the second approach resides in the fact that a total of three read cycles and two write cycles and an assessment cycle are required, which results in that the read operation becomes very slow.

In summary, therefore, it is possible to record that, in the case of the first approach, twice the required space and low resistance fluctuations between adjacent memory cells are necessary, while the second approach, with a total of seven cycles, demands a considerable expenditure of time for a read operation.

In Published, Non-Prosecuted German Patent Application DE 100 36 140 A1, corresponding to U.S. Pat. No. 6,388,917, a description is given of a novel method for the nondestructive reading from memory cells of an MRAM, which requires less time for each read operation, with a low requirement for space.

This novel method contains, in particular, the following method steps:

(a) determining a normal resistance value $R_{norm}$ for a memory cell at a voltage at which the resistance value of the memory cell is independent of its cell content;

(b) determining the actual resistance value R(0) and R(1) of the memory cell at a voltage at which the resistance value of the memory cell depends on its cell content;

(c) normalizing the actual resistance value by use of the normal resistance value by forming $R_{norm}(0)=R(0) R_{norm}$ and $R_{norm}(1)=R(1)R_{norm}$;

(d) comparing $R_{norm}(0)$ and $R_{norm}(1)$ with a normalized reference resistance $R_{normref}=(R_{norm}(0)ref+R_{norm}(1)ref)/2$; and (e) detecting the memory cell content as 0 or 1 on the basis of the comparison result.

In this method, therefore, use is made of a characteristic of MTJ memory cells that has hitherto been paid barely any attention. The resistance value of the tunnel resistance of a memory cell is specifically dependent on the voltage applied to it. In this case, there are voltage ranges in which the tunnel resistance has the same magnitude irrespective of the directions of the polarizations in the two magnetized layers, that is to say is equally large for "1" and "0". In other voltage ranges, on the other hand, given anti-parallel orientation of the polarization in the two magnetized layers, the resistance is greater by ΔR than in the case of parallel orientation of the polarization in these layers, so that here, at this voltage, the cell content can be distinguished as "0" and "1".

The method is, then, based on the fact that, in the voltage range mentioned first, which is to be designated by U1, the resistance $R_C$ of the memory cell can be determined independently of its content, while in the voltage range mentioned at the second point, which is to be specified by U2, the resistance $R_C$ can be detected as a function of the cell content. It is therefore possible to normalize the resistance $R_C(U2)$ which depends on the cell content by the resistance $R_C(U1)$ that is independent of the cell content, in such a way that the contents of various memory cells, which do not have to be adjacent, can again be compared with one another. It is therefore also possible to compare the normalized read signal from an addressed memory cell with a normalized reference signal from a reference cell which is always respectively written with a "0" or a "1", and therefore to detect the content of the memory cell as "1" or "0".

Figure 9:
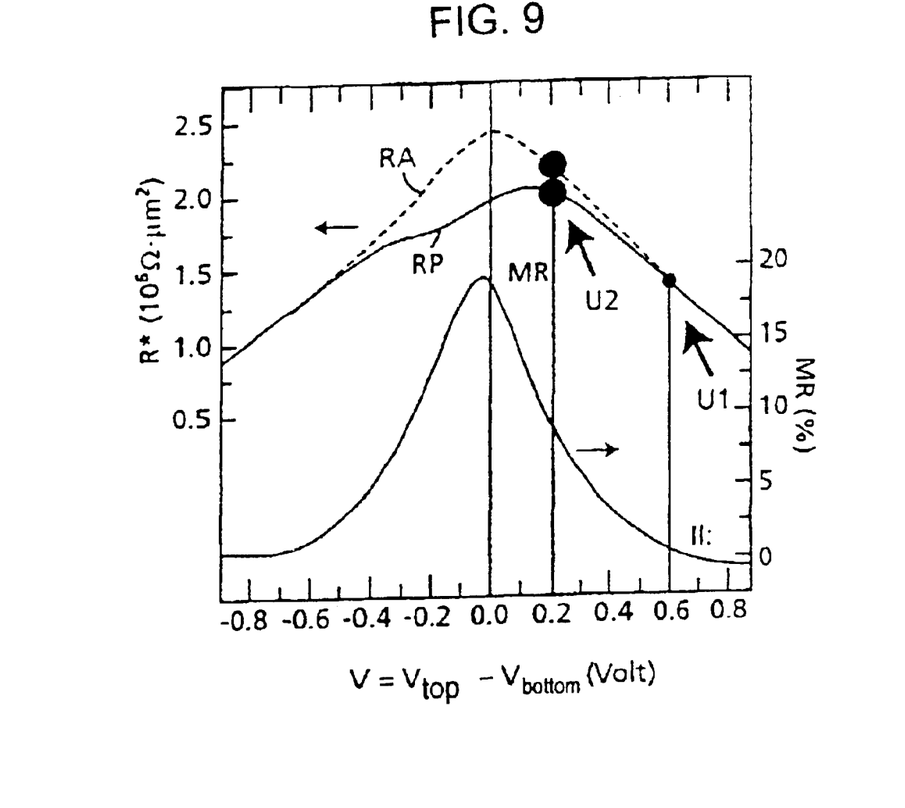
FIG. 9 is a graph showing the dependence of the tunnel resistance for parallel (RP) and anti-parallel (RA) polarization of the magnetized layers of a memory cell as a function of the voltage $V=V_{top}-V_{bottom}$ applied to the memory cell, in curves I, and the resistance ratio $MR=(RA-RP)/RP$, in a curve II.

FIG. 9 shows the area resistance value R* of the tunnel resistance of a memory cell as a function of the voltage $V=V_{top}-V_{bottom}$ applied to the memory cell, $V_{top}$ being applied, for example, to the bit line BL and $V_{bottom}$ to the word line WL (see FIG. 5). In a voltage range between about −0.6 V and +0.6 V, the resistance value RA in the case of anti-parallel polarization of the magnetized layers is greater than the resistance value RP in the case of their parallel polarization. On the other hand, in voltage ranges between −1.0 V and −0.6 V and between 0.6 V and 1.0 V, the resistance value for anti-parallel polarization and parallel polarization of the magnetized layers is approximately the same size. For a voltage U2=0.2 V, RA is therefore greater than RP, while for a voltage U1=0.6 V, it is approximately true that RP (U1)=RA (U1). For U2, on the other hand, it is true that RA (U2)=RP (U2)+ΔR.

A curve MR=(RA−RP)/RP illustrates the above effect, based on the difference between the resistance values RA and RP.

In other words, at the voltage U2 it is possible to detect the content of a memory cell while, when the voltage U1 is present, a resistance value which is the same for parallel and anti-parallel polarization of the magnetized layers is obtained, and can be used to normalize the resistance value of the memory cell.

The method is, then, in principle based on the fact that at the voltage U1, the resistance value $R_C(U1)$ of the memory cell can be determined independently of the cell content, while at the voltage U2, the resistance value $R_C(U2)$ of the memory cell can be detected as a function of the cell content. This makes it possible to normalize the resistance $R_C(U2)$ that depends on the cell content by use of the resistance $R_C(U1)$ that is independent of the cell content, that is to say to form $R_C(U2)/R_C(U1)$, so that the cell content of various memory cells, which do not have to be adjacent to one another, can again be compared with one another. Using the method, it is therefore possible to compare the normalized read signal from an addressed memory cell with normalized reference signals from, for example, reference memory cells, which are always respectively written with a "0" and a "1", so that the cell content of the addressed memory cell can be detected as "1" or "0".

Figure 10:
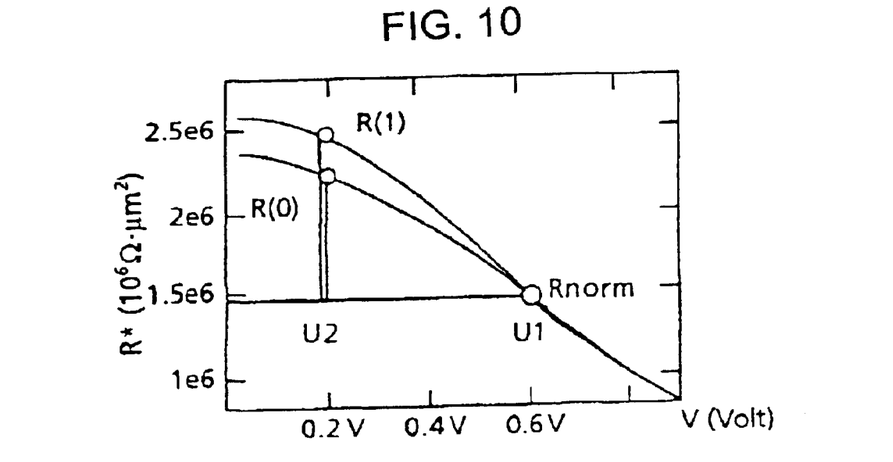
FIG. 10 is a graph showing a schematic representation to further explain the dependence of the resistance of a memory cell on the voltage across the memory cell, here the area resistance being plotted as a function of the contact voltage.

This procedure is to be explained in more detail again by using FIG. 10, in which the area resistance R* is again plotted as a function of the contact voltage V.

First, the normal resistance value $R_{norm}$ is determined at the voltage U1=0.6 V, for example, and is stored. Then, at the voltage U2=0.2 V, the cell content with the resistance value R(0) and R(1) is determined on the basis of the anti-parallel (R(1)) and parallel (R(0)), respectively, polarization of the magnetized layers. This is then followed by the normalization of R(0) and R(1) to $R_{norm}$, that is to say $R_{norm}(0)=R(0)/R_{norm}$ and $R_{norm}(1)=R(1)/R_{norm}$ are formed. This is followed by a comparison between $R_{norm}(0)$ and $R_{norm}(1)$ with a reference resistance value $R_{normref}=(R_{norm}(0)ref+R_{norm}(1)ref)/2$ from a reference memory cell, which has previously been recorded. Finally, the cell content is detected as "0" or "1" as the result of this comparison.

The method therefore specifically makes the following advantages possible. It may be carried out irrespective of the scatter of resistance values of memory cells. It only requires two time steps to execute it. As a result of the normalization of the read signal, a comparison with external reference signals becomes possible. It is thus superior in every respect to the existing methods explained at the beginning. Finally, the novel method can be applied to all types of various MTJ memory cells, that is to say to pure MTJ memory cells, to MTJ memory cells with diodes and MTJ memory cells with transistors.

SUMMARY OF THE INVENTION

It is accordingly an object of the invention to provide a circuit for non-destructive, self-normalizing reading-out of MRAM memory cells that overcomes the above-mentioned disadvantages of the prior art devices of this general type, which has a simple construction and without great expenditure permits the normalization of a read signal.

With the foregoing and other objects in view there is provided, in accordance with the invention, a combination of MRAM memory cells with a circuit for non-destructive, self-normalizing reading-out of the MRAM memory cells. The circuit determines a normal resistance value $R_{norm}$ of a memory cell using a first voltage at which a resistance value of the memory cell is independent of a cell content, and an actual resistance value R(0) or R(1) of the memory cell using a second voltage at which the resistance value of the memory cell depends on the cell content. The actual resistance value is then normalized by use of the normal resistance value in the equation $$R_{norm}(0)=R(0)/R_{norm} \text{ and,}$$

$$R_{norm}(1)=R(1)/R_{norm}$$

and $R_{norm}(0)$ and $R_{norm}(1)$ are compared with a reference value, and the memory cell content is detected as a 0 or 1 on a basis of a comparison result. The circuit contains a branch having at least one capacitor, a switch connected to the capacitor, a main output, and a balanced circuit connected to the memory cell, the branch and the output. The balanced circuit has a transistor and mirrors a current flowing during a determination of the normal resistance value $R_{norm}$ into the branch having the capacitor, so that after the switch has been opened, the normal resistance value $R_{norm}$ can be buffered by the capacitor and the transistor. The balance circuit permits a current $I_{cell}(0, 1)$ flowing during a determination of the actual resistance value to flow in the branch, so that a normalized output voltage $U_{out}(0,1)=R_{norm} \cdot I_{cell}(0,1)$ is obtained at the main output.

In the circuit according to the invention, therefore, the memory cell is connected to a balanced circuit, which mirrors the current flowing during the determination of the normal resistance value $R_{norm}$ into a branch having at least one capacitor, so that after a switch has been switched off, the normal resistance value can be buffered by the capacitor and a transistor, and permits the current that flows during the determination of the actual resistance value to flow into the branch, as a result of which a normalized output voltage $U_{out}(0,1)=R_{norm} \cdot I_{cell}(0,1)+U_{WL(read)}$ is obtained at an output ($U_{WL(read)}=0.8$ V, voltage read on the word line).

In the circuit according to the invention, the current $I_{std}$ that flows during the determination of the normal resistance value $R_{norm}$ is used to normalize the current $I_{cell}(0)$ and $I_{cell}(1)$, and to obtain the normalized output voltage $U_{out}(0)$ and $U_{out}(1)$, which is then compared with a normalized reference voltage $U_{ref}$ in order to detect the cell content as a "0" or "1". This procedure with normalization of the currents is possible since the resistances are directly proportional to the currents and, as a result, the normalization is maintained.

In accordance with an added feature of the invention, a bit line and a word line are provided. The balanced circuit has a further transistor of a given conductivity type connected to the memory cell. A series circuit containing the memory cell and the further transistor is disposed between the word line and the bit line.

In accordance with an additional feature of the invention, the balanced circuit has the transistor being a first transistor of a first conductivity type, the further transistor of the given conductivity type being a second transistor of a second conductivity type, and a third transistor of the second conductivity type. A series circuit containing the first transistor and the third transistor is disposed between the word line and a supply voltage and is connected in the branch containing the capacitor.

In accordance with another feature of the invention, the second transistor has a gate, and the third transistor has a gate connected to the gate of the second transistor.

In accordance with a further feature of the invention, an amplifier is provided and has a positive input connected to a junction between the memory cell and the second transistor, and a negative input.

In accordance with another added feature of the invention, a positive voltage terminal for a further supply voltage, is provided. A further amplifier is provided and has a first input connected to the negative input of the amplifier and to the positive voltage terminal.

In accordance with another additional feature of the invention, the amplifier has an output connected to a junction between the gates of the second and third transistors. The further amplifier has a second input connected to a junction between the first and third transistors. The further amplifier has an output connected through the switch to a junction between the capacitor and a gate of the first transistor.

In accordance with a concomitant feature of the invention, the main output is disposed between the third transistor and the first transistor.

Other features which are considered as characteristic for the invention are set forth in the appended claims.

Although the invention is illustrated and described herein as embodied in a circuit for non-destructive, self-normalizing reading-out of MRAM memory cells, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

In all the figures of the drawing, sub-features and integral parts that correspond to one another bear the same reference symbol in each case. Referring now to the figures of the drawing in detail and first, particularly, to FIG. 1 thereof, there is shown an MTJ memory cell which is symbolized by a resistor $R_{cell}$ (also referred to above as $R_C$), which here, in series with a p-MOS field effect transistor TP1, is located between a bit line BL and a word line WL at a word line voltage UWL, which may be, for example, 0.4 V and 0.8 V.

Figure 1:
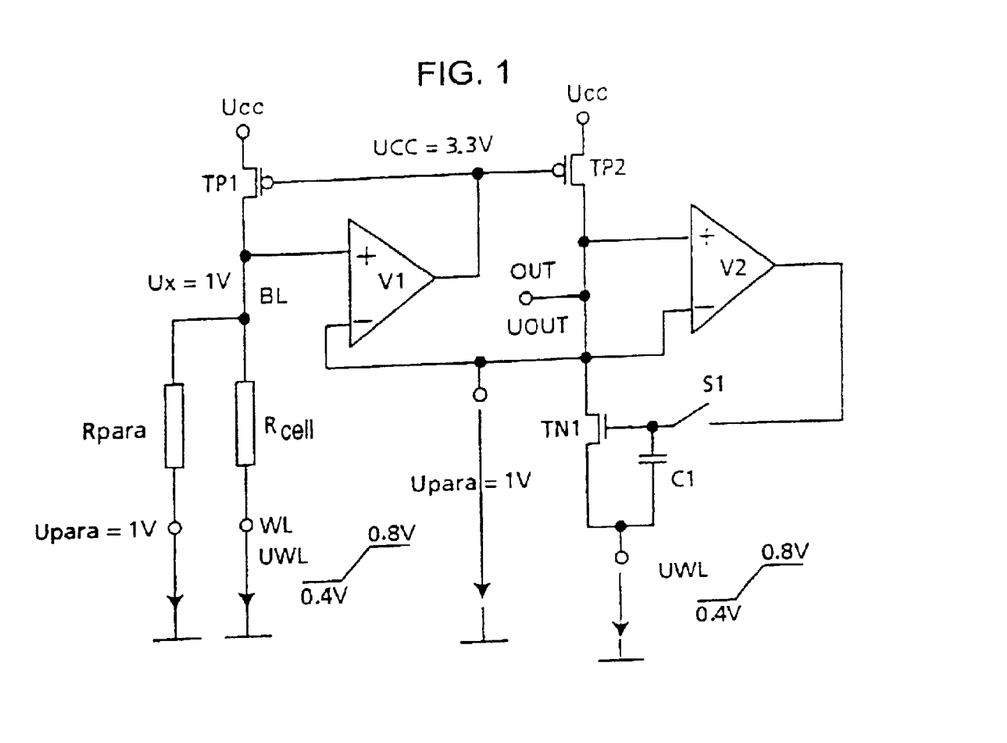
FIG. 1 is a schematic circuit diagram of a first exemplary embodiment of a circuit with p-MOS field effect transistors according to the invention.

It is assumed here that the memory cell $R_{cell}$ is an addressed MTJ memory cell belonging to a memory cell array. Corresponding considerations apply to its other memory cells.

A resistance $R_{para}$, which lies parallel to the memory cell having the resistance $R_{cell}$, is intended to symbolize the parasitic resistances of the other memory cells which are connected to the bit line BL.

A differential amplifier V1 is connected by its positive input (+) to a junction between the transistor TP1 and the memory cell $R_{cell}$, and by its negative input (−) to a voltage $U_{para}$ of, for example, 1 V and to the negative input (−) of a further differential amplifier V2. An output of the differential amplifier V1 is connected to a gate of the transistor TP1 and to a gate of a p-MOS field effect transistor TP2, to whose source a voltage Ucc of, for example, 3.3 V is applied. A drain of the transistor TP2 is connected to a negative input (−) of the further differential amplifier V2, to an output OUT and to the drain of an n-MOS field effect transistor TN1, whose source is at the word line voltage UWL and is connected via a capacitor C1 to its gate. An output of the further differential amplifier V2 is connected via a switch S1 to a gate of the transistor TN1.

On the negative input (−) of the differential amplifier V1 there is to be, for example, the voltage $U_{para}$ of 1 V plus a voltage for "offset" compensation, so that between the positive input (+) of the differential amplifier V1, to which a voltage $U_x$=1 V is applied, and the negative input (−) of the differential amplifier V1, there is a voltage drop of approximately 0 V. The remainder of the lines in the cell array are likewise to be at, for example, $U_{para}$=1 V.

Of course, the voltage values indicated are merely examples and, in fact, can readily differ from these, depending on the technology used. It is to be assumed merely that the differential amplifier V1 is offset-compensated.

Initially, the word line voltage UWL is 0.4 V. The voltage across the memory cell $R_{cell}$ is then $U_{cell}$=U1=1 V−0.4 V=0.6 V. Here, the switch S1 is closed. The differential amplifier V1 then controls the transistor TP1 in such a way that the current through the memory cell corresponds to the current through the transistor TP1 and the current through the transistor TP2.

Since 0.6 V is present across the memory cell $R_{cell}$, the current $I_{cell}$ flowing through the memory cell corresponds to the normal current $I_{std}$ (in this regard, see also FIG. 9). Therefore, the resistance value of the memory cell $R_{cell}$ assumes the magnitude $R_{norm}=U_{cell}/I_{std}$ for the voltage $U_{cell}$=0.6 V.

If, then, the switch S1 is opened, the resistance value $R_{norm}$ is stored on the transistor TN1 by the capacitor C1.

Let it be assumed that the word line voltage UWL then goes to 0.8 V and the switch S1 remains open. The voltage $U_{cell}$ across the memory cell $R_{cell}$ is then given by $U_{cell}$=U1=1 V−0.8 V=0.2 V. At this voltage, the resistance value of the memory cell $R_{cell}$ depends on the magnetization directions in the individual magnetized layers ML1 and ML2 (see FIGS. 9 and 10). The differential amplifier V1 controls the transistor TP1 in such a way that the current $I_{cell}$ corresponds to the current through the transistor TP1 and therefore also to the current through the transistor TP2.

The resistance value of the memory cell $R_{cell}$ at the voltage $U_{cell}$=0.2 V now has the value R(0) or the value R(1), depending on the parallel or anti-parallel magnetization. In other words, it is true that $R_{cell}(U_{cell}$=0.2 V)=R(0,1).

The output voltage $U_{out}(0,1)=R_{norm} \cdot I_{cell}(0,1)=(U_{cell}/I_{std}) \cdot I_{cell}(0,1)$ is then obtained at the output OUT.

Finally, the output voltage $U_{out}(0,1)$ is further compared with a normalized reference voltage by a comparator, and is detected as a "1" or "0" signal. The reference voltage can be derived from a reference source or a reference cell.

The circuit of the exemplary embodiment according to FIG. 1 can readily also be constructed in a complementary form and, instead of the p-MOS field effect transistors TP1 and TP2, n-MOS field effect transistors TN1' and TN2' can be used, the n-MOS transistor TN1 of the example of FIG. 1 then being replaced by a p-MOS field effect transistor TP1'. A corresponding circuit is shown in FIG. 2.

Figure 2:
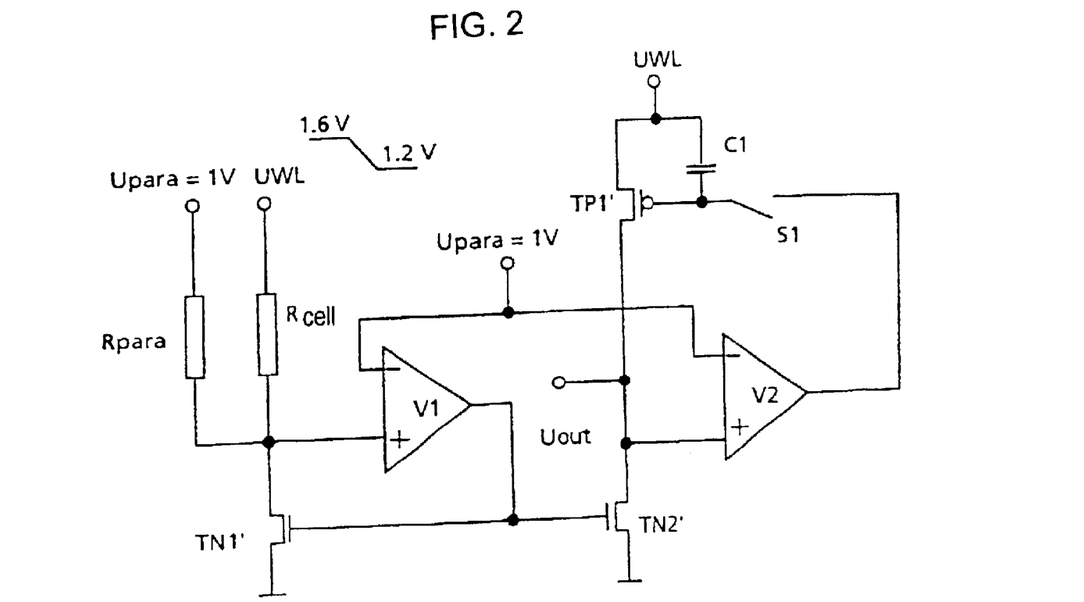
FIG. 2 is a schematic circuit diagram of a second exemplary embodiment of the circuit with n-MOS field effect transistors according to the invention.

The exemplary embodiment of FIG. 2 operates in an analogous way to the exemplary embodiment of FIG. 1, so that in addition only the following is noted. The normal resistance $R_{norm}$ is projected onto the capacitor C1 by the transistor TP1' in the example according to FIG. 2. Across the memory cell $R_{cell}$, as in the exemplary embodiment of FIG. 1, there is a voltage drop of 0.6 V and 0.2 V, by values of 1.6 V and 1.2 V being assumed for the word line voltage UWL.

The exemplary embodiment of FIG. 2 may be particularly advantageous if appropriate differential amplifiers V1 and V2 are used.

Figure 3:
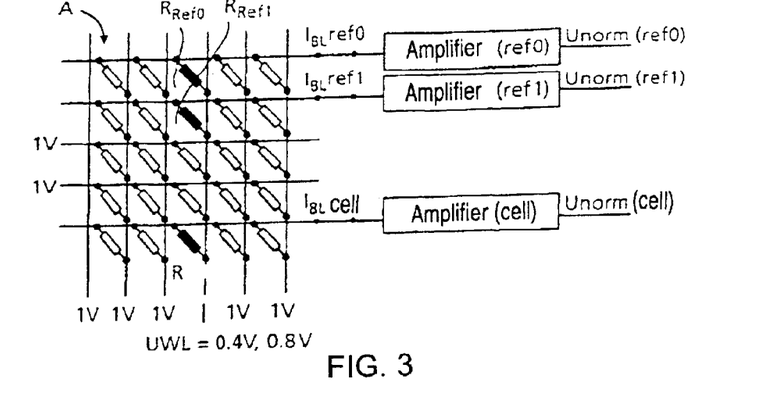
FIG. 3 is a circuit diagram for explaining the referencing of a normalized read signal by use of normalized reference signals for "1" and "0"
Figure 4:
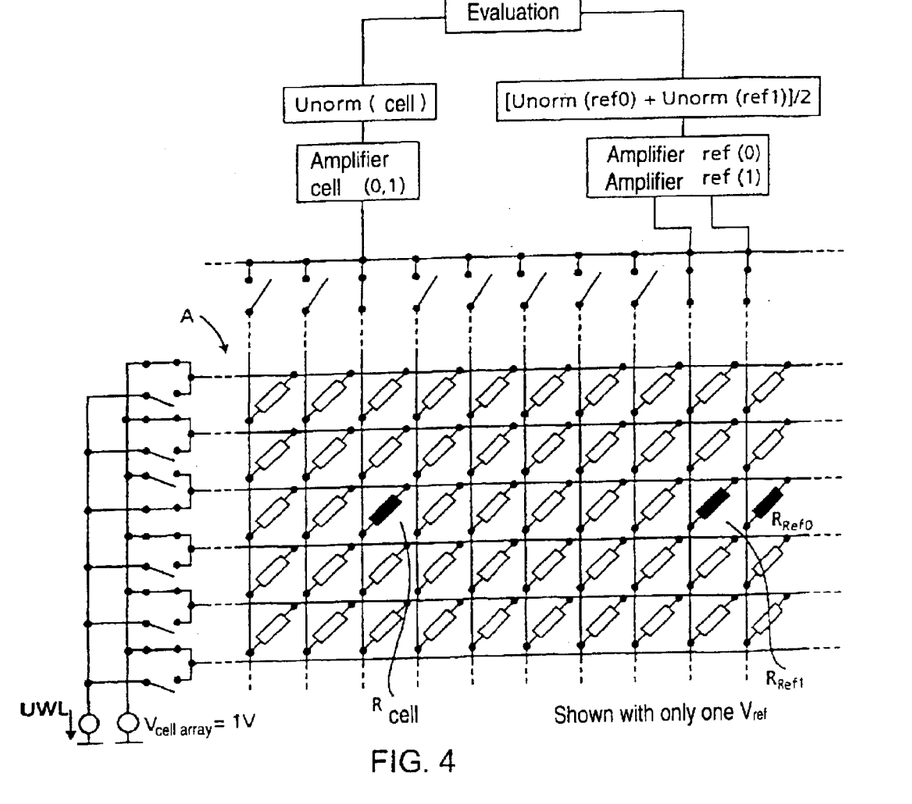
FIG. 4 is a circuit diagram for explaining the self-normalized detection of a cell signal.

FIG. 3 shows an example of a circuit for possible referencing of a read signal with the aid of reference cells $R_{ref0}$ and $R_{ref1}$, into which in each case a "0" and a "1" have been written permanently. In this case, the same voltage UWL is applied to the reference cell $R_{ref1}$, into which a "1" has previously been written, and to the reference cell $R_{ref0}$, into which a "0" has previously been written, as to the cell $R_{cell}$ to be read. In this case, the reference cells $R_{ref0}$ and $R_{ref1}$ and the cell $R_{cell}$ to be read are in each case connected to an amplifier "amplifier (ref1)", an amplifier "amplifier (ref0)" and an amplifier "amplifier (cell)", in order in each case to generate a normalized signal $U_{std}$(ref1), $U_{std}$(ref0) and $U_{std}$ (cell), which is given by $U_{std}$(ref1)=1 V+(UBL−UWL) ($R_{norm1}/R_{norm1}$), $U_{std}$(ref0)=1 V+(UBL−UWL) ($R_{norm0}/R_{ref0}$) and $U_{std}$(cell)=1 V+(UBL−UWL) ($R_{normcell}/R_{refcell}$). By comparing the normalized cell signal with the reference signal $U_{stdref}$=($U_{std}$(ref0)+$U_{std}$(ref1))/2 obtained from the normalized reference cell signals $U_{std}$(ref0) and $U_{std}$(ref1), it is then possible, as shown in FIG. 4, for the cell content of the cell $R_{cell}$ in the memory array A to be detected in an evaluation step.

We claim:

1. In combination with MRAM memory cells, a circuit for non-destructive, self-normalizing reading-out of the MRAM memory cells, the circuit deriving a normal resistance value $R_{norm}$ of a memory cell using a first voltage at which a resistance value of the memory cell being independent of a cell content, and an actual resistance value R(0) or R(1) of the memory cell using a second voltage at which the resistance value of the memory cell depends on the cell content, the actual resistance value is then normalized by use of the normal resistance value in the equation $R_{norm}(0)=R(0)/R_{norm}$ and, $R_{norm}(1)=R(1)/R_{norm}$ and $R_{norm}(0)$ and $R_{norm}(1)$ are compared with a reference value, and, the memory cell content is detected as a 0 or 1 on a basis of a comparison result, the circuit comprising:

a branch having at least one capacitor;

a switch connected to said capacitor;

a main output; and a balanced circuit connected to the memory cell, said branch and said output, said balanced circuit having a transistor and mirrors a current flowing during a determination of the normal resistance value $R_{norm}$ into said branch having said capacitor, so that after said switch has been opened, the normal resistance value $R_{norm}$ can be buffered by said capacitor and said transistor, said balance circuit permits a current $I_{cell}(0, 1)$ flowing during a determination of the actual resistance value to flow in said branch, so that a normalized output voltage $U_{out}(0,1)=R_{norm} \cdot I_{cell}(0,1)$ is obtained at said main output.

2. The circuit according to claim 1, further comprising a bit line;

further comprising a word line; and wherein said balanced circuit has a further transistor of a given conductivity type connected to the memory cell, and a series circuit containing the memory cell and said further transistor, said memory cell being disposed between said word line and said bit line.

3. The circuit according to claim 2, wherein said balanced circuit having said transistor being a first transistor of a first conductivity type, said further transistor of said given conductivity type is a second transistor of a second conductivity type, and a third transistor of said second conductivity type, a series circuit containing said first transistor and said third transistor is disposed between said word line and a supply voltage and connected in said branch containing said capacitor.

4. The circuit according to claim 3, wherein said second transistor has a gate, and said third transistor has a gate connected to said gate of said second transistor.

5. The circuit according to claim 4, further comprising an amplifier having a positive input connected to a junction between the memory cell and said second transistor, and a negative input.

6. The circuit according to claim 5, further comprising:

a positive voltage terminal for a further supply voltage; and a further amplifier having a first input connected to said negative input of said amplifier and to said positive voltage terminal.

7. The circuit according to claim 6, wherein said amplifier has an output connected to a junction between said gates of said second and third transistors.

8. The circuit according to claim 7, wherein said further amplifier has a second input connected to a junction between said first and third transistors.

9. The circuit according to claim 8, wherein said further amplifier has an output connected through said switch to a junction between said capacitor and a gate of said first transistor.

10. The circuit according to claim 9, wherein said main output is disposed between said third transistor and said first transistor.

11. A circuit for non-destructive, self-normalizing reading-out of MRAM memory cells, the circuit comprising:

a branch having at least one capacitor;

a switch connected to said capacitor;

a main output; and a balanced circuit connected to a memory cell, said branch and said output, said balanced circuit having a transistor and mirrors a current flowing during a determination of a normal resistance value $R_{norm}$ into said branch having said capacitor, so that after said switch has been opened, the normal resistance value $R_{norm}$ can be buffered by said capacitor and said transistor, said balance circuit permits a current $I_{cell}(0, 1)$ flowing during a determination of an actual resistance value to flow in said branch, so that a normalized output voltage $U_{out}(0,1)=R_{norm} \cdot I_{cell}(0,1)$ is obtained at said main output;

the circuit deriving the normal resistance value $R_{norm}$ of the memory cell using a first voltage at which a resistance value of the memory cell being independent of a cell content, and deriving the actual resistance value $R(0)$ or $R(1)$ of the memory cell being determined at a second voltage at which the resistance value of the memory cell depends on the cell content, the actual resistance value is then normalized by use of the normal resistance value in the equation $$R_{norm}(0)=R(0)/R_{norm} \text{ and,}$$

$$R_{norm}(1)=R(1)/R_{norm}$$

and $R_{norm}(0)$ and $R_{norm}(1)$ are compared with a reference value, and, finally, the memory cell content is detected as a 0 or 1 on a basis of a comparison result.

* * * * *